(12) United States Patent
Lee

(10) Patent No.: US 7,112,510 B2
(45) Date of Patent: Sep. 26, 2006

(54) METHODS FOR FORMING A DEVICE ISOLATING BARRIER AND METHODS FOR FORMING A GATE ELECTRODE USING THE SAME

(75) Inventor: Kae Hoon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 126 days.

(21) Appl. No.: 10/764,637

(22) Filed: Jan. 26, 2004

(65) Prior Publication Data

US 2004/0157405 A1  Aug. 12, 2004

(30) Foreign Application Priority Data

Feb. 4, 2003  (KR)  ............ 10-2003-0007017

(51) Int. Cl.
*H01L 21/76* (2006.01)

(52) U.S. Cl. ............ 438/424; 438/425; 438/426

(58) Field of Classification Search ............ 438/585, 438/287, 424, 425, 426, 427, 428, 430
See application file for complete search history.

(56) References Cited

U.S. PATENT DOCUMENTS

| | | | |
|---|---|---|---|
| 6,097,076 A * | 8/2000 | Gonzalez et al. | 438/287 |
| 6,593,175 B1 * | 7/2003 | Feudel et al. | 438/152 |
| 6,790,754 B1 * | 9/2004 | Park | 438/585 |
| 6,849,532 B1 * | 2/2005 | Kim | 438/592 |
| 6,852,599 B1 * | 2/2005 | Kim | 438/289 |
| 6,855,604 B1 * | 2/2005 | Lee | 438/270 |
| 6,864,164 B1 * | 3/2005 | Dakshina-Murthy et al. | 438/585 |

* cited by examiner

*Primary Examiner*—Walter L. Lindsay, Jr.
(74) *Attorney, Agent, or Firm*—Andrew D. Fortney

(57) ABSTRACT

Methods for forming a device isolating barrier, and methods for forming a gate electrode using the device isolation barrier are disclosed. In an illustrated method, a semiconductor device isolating barrier is formed by forming a pad oxide layer and a first nitride layer on a semiconductor substrate; forming a trench region by etching the pad oxide layer and the first nitride layer; forming spacers at sidewalls of the etched pad oxide layer and the etched first nitride layer; forming a first trench by etching the semiconductor substrate using the spacers and the etched first nitride layer as a mask; and, after forming a liner oxide layer and an oxide layer filling the trench, forming the device isolating barrier by flattening the liner oxide layer and the trench oxide layer to expose the etched first nitride layer.

12 Claims, 6 Drawing Sheets

US 7,112,510 B2

METHODS FOR FORMING A DEVICE ISOLATING BARRIER AND METHODS FOR FORMING A GATE ELECTRODE USING THE SAME

FIELD OF THE DISCLOSURE

The present disclosure relates generally to semiconductor devices; and, more particularly, to methods for forming a device isolating barrier, and methods for forming a gate electrode using the device isolation barrier.

BACKGROUND

Conventional methods for forming a semiconductor device isolating barrier include a LOCOS (Local Oxidation of Silicon) method using a nitride layer and an STI (Shallow trench isolation) method which isolates devices by forming a trench on a surface of the semiconductor substrate.

Since the LOCOS method employs a simple process of thermal oxidization of a semiconductor substrate using a nitride layer as a mask, element stress of the oxide layer is small and the generated oxide layer has high quality. However, the device isolating region occupies a large area, thereby limiting the miniaturization of the semiconductor device. On the contrary, in the STI method, after a trench is formed on a surface of a semiconductor substrate, the trench is filled with an insulating film which is subsequently flattened. Accordingly, the STI method creates a small device isolating region, thereby having an advantage with respect to miniaturization of the semiconductor device.

FIGS. 1A to 1F are cross-sectional views showing a conventional insolating method in which a trench is formed on a surface of a semiconductor substrate. As shown in FIG. 1A, after a pad oxide layer 2 having a thickness of about 150 Å is formed on a semiconductor substrate 1, a nitride layer 3 having a thickness of about 2000 Å is formed on the pad oxide layer 2. After a photoresist layer 4 is coated on the nitride layer 3, the photoresist layer 4 is exposed and developed to form a mask to create a trench, (i.e., a device isolating region), on a surface of the semiconductor substrate 1.

As shown in FIG. 1B, a trench T, (i.e., a device isolating region), is formed by etching the semiconductor substrate 1 to a depth of about 3000 Å to about 7000 Å and a width of about 300 Å to about 500 Å after etching the portions of the nitride layer 3 and the pad oxide layer 2 exposed through developing of the photoresist layer 4.

Referring to FIG. 1C, the trench T is filled by depositing a thick insulating layer 6, (i.e., an oxide layer), on a surface of the semiconductor substrate 1 by performing a CVD (chemical vapor deposition) process. Prior to performing the CVD process, a liner oxide layer 5 is formed inside the trench T such that the trench T makes good contact with the filling oxide layer 6 in the process of filling the trench with the insulating layer 6 and such that an edge of the trench is rounded.

Referring to FIG. 1D, after coating the insulating layer 6 with a photoresist layer 7, the photoresist layer 7 is exposed and developed by using a mask. As a result, the photoresist layer pattern 7 remains only on the insulating layer 6 above the trench T. An insulating layer pattern 6a is formed by etching the insulating layer 6 using the photoresist layer pattern 7 as a mask.

As shown in FIG. 1E, after removing the photoresist layer pattern 7, a device isolating barrier 8, (i.e., flattened insulating layer pattern 6a), is formed by polishing and flattening the insulating layer pattern 6a to the height of the nitride layer 3 through a CMP (chemical mechanical polishing) process.

As shown in FIG. 1F, when the exposed nitride layer 3 is removed by wet etching using phosphoric acid, the semiconductor substrate 1 is divided into active regions at both sides of the device isolating barrier 8 and a device isolating region corresponding to the device isolating barrier 8.

In the conventional semiconductor device isolating method, the oxide layer and the nitride layer 3 are flattened, and then the exposed nitride layer 3 is removed by phosphoric acid. During the flattening of layers, an electric field is concentrated on a periphery A of the trench T, as shown in FIG. 1F, thereby causing the Kink effect, (i.e., leakage current generation at the trench T), which deteriorates the reliability and characteristics of the semiconductor device.

Although not shown in the drawings, after a gate electrode including a conducting layer is formed on the active region by using a general gate electrode forming method, drain/source regions are formed employing the gate electrode as a criterion by executing impurity ion implantation.

In this case, a problem occurs in that a device isolation resistance is changed since impurities are also doped inside the trench during the impurity ion implantation to form the drain/source regions.

DETAILED DESCRIPTION

FIGS. 2A to 2I are cross-sectional views illustrating an example method for forming a semiconductor device insolating barrier and an example method for forming a gate electrode.

Figure 1A:
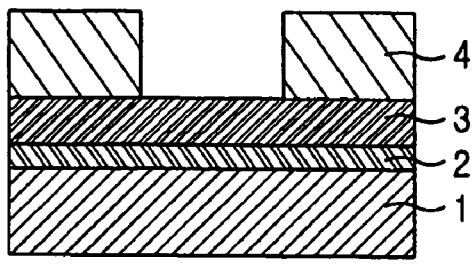
FIGS. 1A to 1F are cross-sectional views showing a conventional insolating method
Figure 1B:
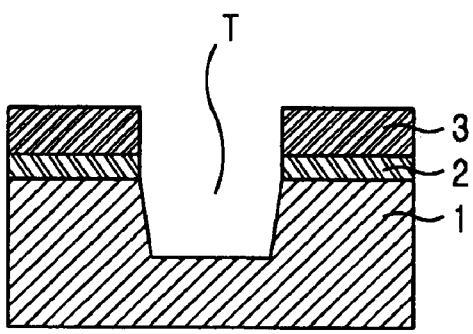
Figure 1C:
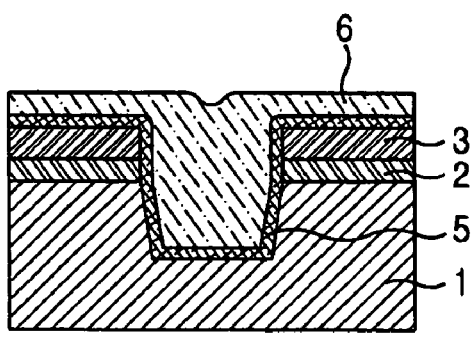
Figure 1D:
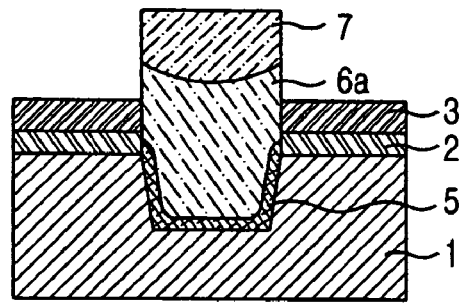
Figure 1E:
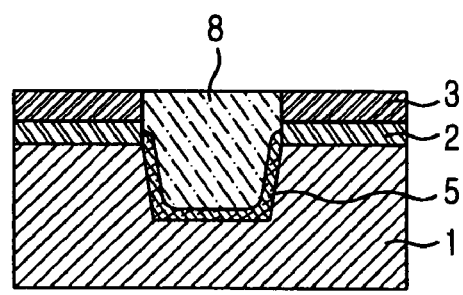
Figure 1F:
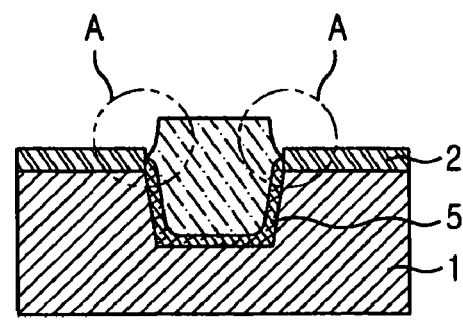
Figure 2A:
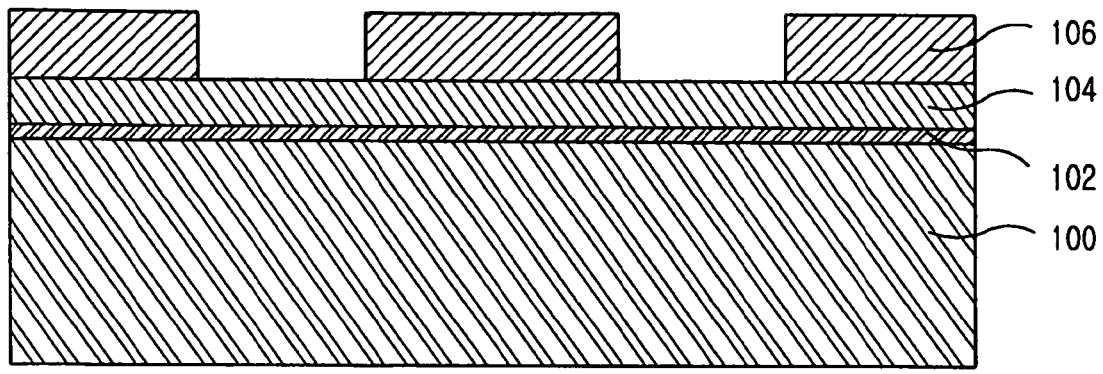
FIGS. 2A to 2K are cross-sectional views illustrating an example method for forming a gate electrode in accordance with the teachings of the present disclosure.

Referring to FIG. 2A, a preferred example sequentially accumulates a pad oxide layer 102 and a first nitride layer 104 on top of a semiconductor substrate 100. Then, a photoresist layer is coated on the first nitride layer 104. Subsequently, a first photoresist layer pattern 106 is formed by removing the portion of the photoresist layer where a first trench will be formed through an exposure and developing process performed on the coated photoresist layer. The thickness of the first nitride layer 104 may range from about 500 to about 1000 Å.

Figure 2B:
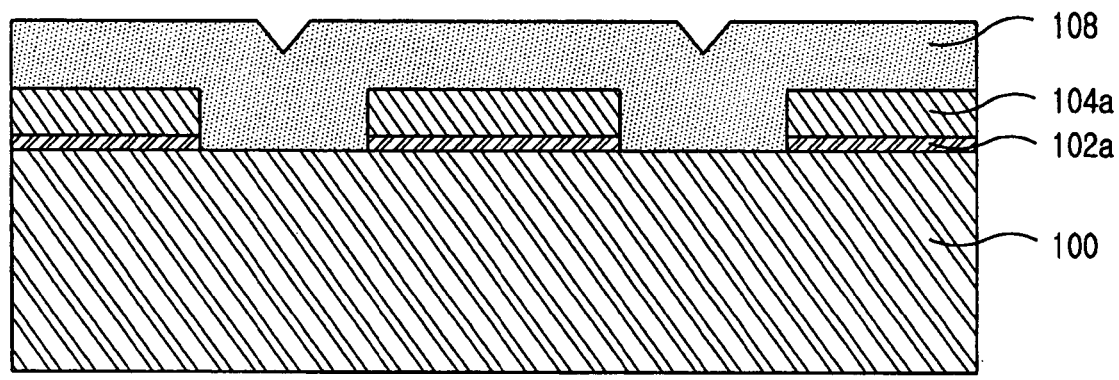

As shown in FIG. 2B, after the pad oxide layer 102 and the first nitride layer 104 are etched by using the first photoresist layer pattern 106 as a mask, the first photoresist layer pattern 106 is removed. An oxide layer 108 is then formed on the semiconductor substrate 100 to fill the holes etched in the pad oxide layer 102a and the first nitride layer 104a.

Figure 2C:
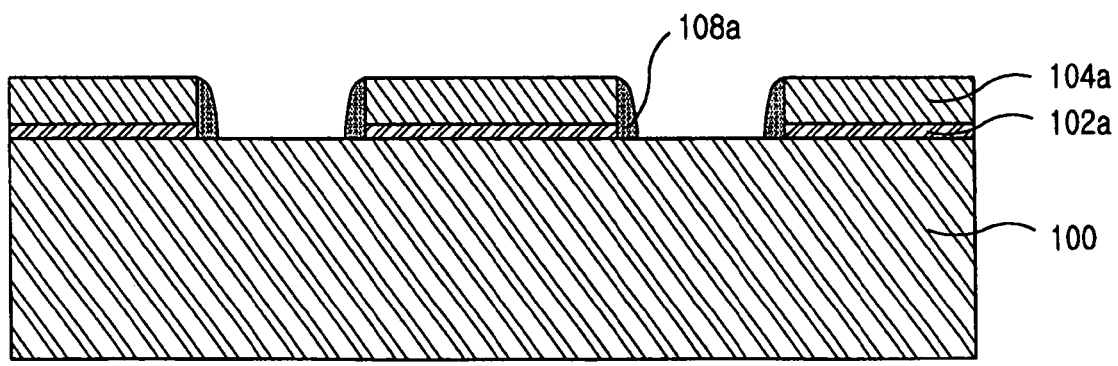

Next, as shown in FIG. 2C, oxide layer spacers 108a are formed at the sidewalls of the etched pad oxide layer 102a and the first nitride layer 104a by removing a part of the oxide layer 108 through an etch back process.

Figure 2D:
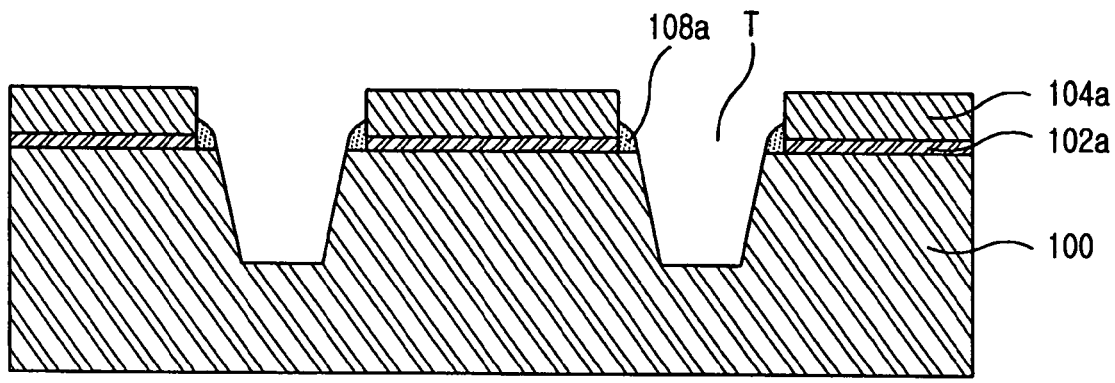

Then, as shown in FIG. 2D, the trench T is formed by etching the exposed semiconductor substrate 100 using the etched first nitride layer 104a and oxide layer spacer 108a as a mask.

Figure 2E:
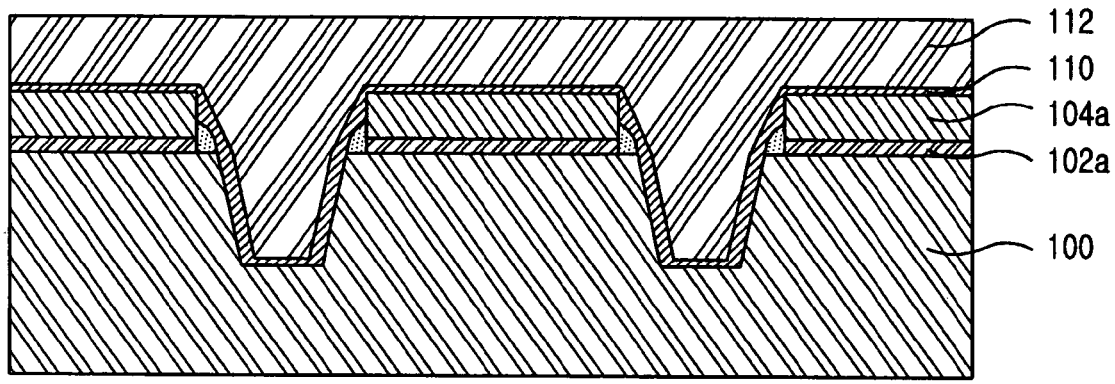

As shown in FIG. 2E, after a liner oxide layer 110 is formed on the semiconductor substrate 100 and inside the first trench T, a trench oxide layer 112 is formed to fill the trench T.

Figure 2F:
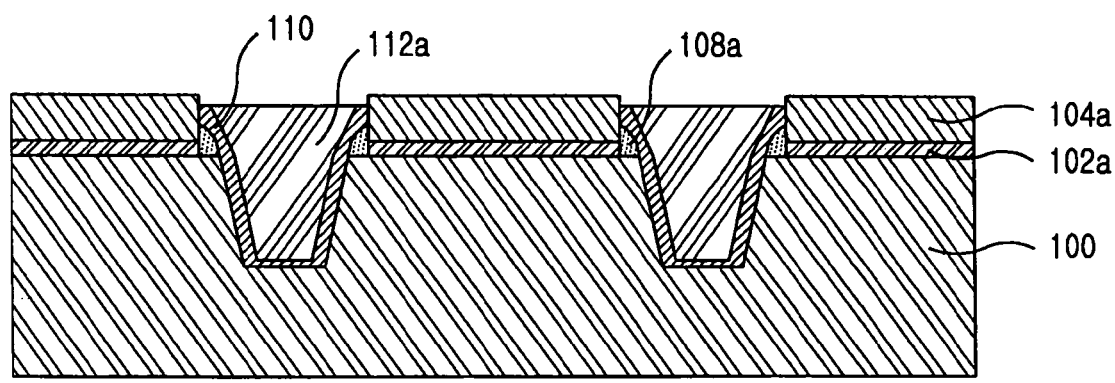

Next, as shown in FIG. 2F, a device isolating barrier 112a is formed by removing the trench oxide layer 112 and the liner oxide layer 110 through a flattening process. As a result of the flattening process, the etched first nitride layer 104a is exposed and the trench oxide layer 112 is left only inside the first trench T. A CMP process may be applied as the flattening process.

Figure 2G:
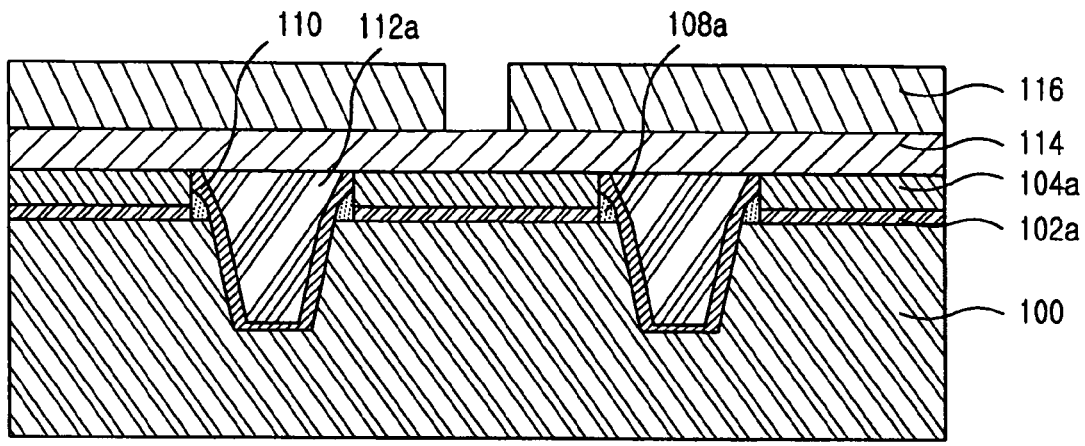

Referring to FIG. 2G, a second nitride layer 114 is formed on the structure of FIG. 2F. A second photoresist layer pattern 116 to define a gate region is then formed on the second nitride layer 114. The thickness of the second nitride layer 114 may range from about 1000 to about 1500 Å.

Figure 2H:
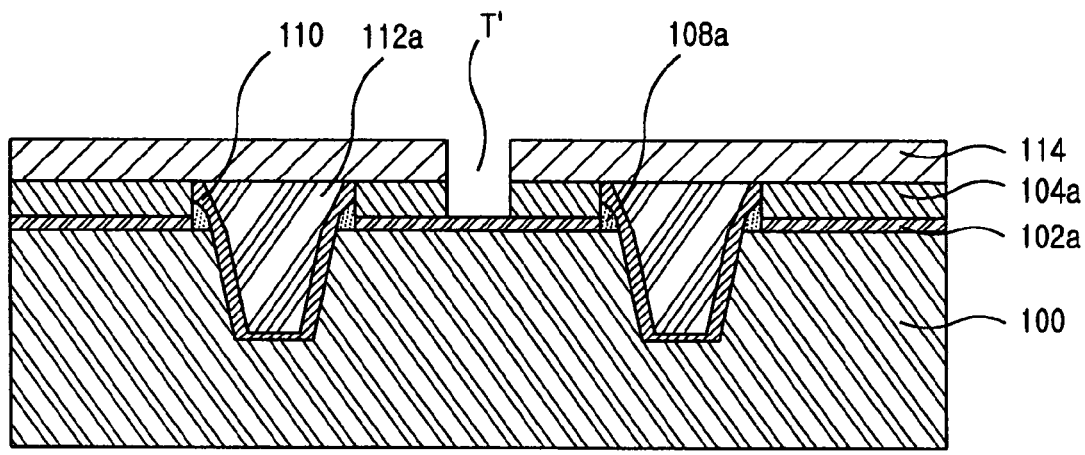

As shown in FIG. 2H, after a second trench T' is formed by etching the second nitride layer 114 and the etched first nitride layer 104a using the second photoresist layer pattern 116 as a mask, the second photoresist layer pattern 116 is removed. When the second trench T' is formed, an etching gas is used which has a selectivity of a multi-layer structured nitride layer (composed of the second nitride layer 114 and the etched first nitride layer 104a) with respect to the oxide layer that is greater than 7:1, (e.g., a gas mixture of CO, $CHF_3$ and $C_4F_8$).

Figure 2I:
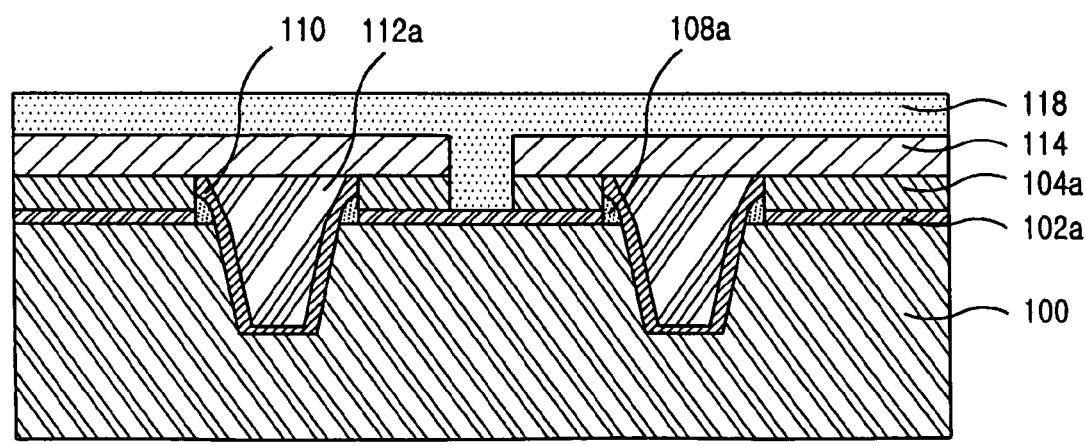
Figure 2J:
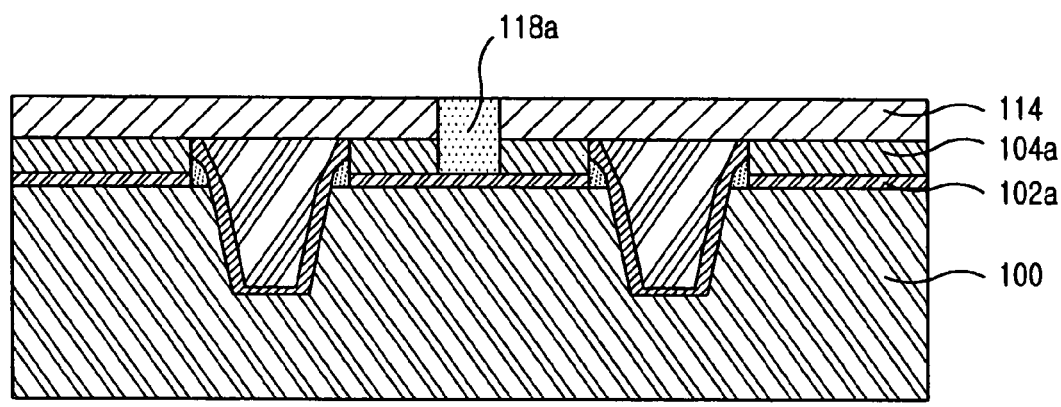

As shown in FIGS. 2I and 2J, a conducting layer 118 is formed to fill the second trench T'. Subsequently, the conducting layer 118 is removed through a flattening process to again expose the second nitride layer 114. A doped polysilicon or an undoped polysilicon may be used as the conducting layer 118. The conducting layer 118 may be deposited to fill the second trench T' through a LPCVD (low-pressure chemical vapor deposition) process at about 550 to about 650° C. The thickness of the deposited conducting layer 118 may range from about 2000 to 5000 Å.

The flattening process is executed using a CMP method. The thickness of the nitride layer left after the flattening process ranges from about 10 to about 90% of the thickness of the nitride layer before the flattening process. During the flattening process, the thickness of the conducting layer 118 can be modulated by using an EPD (endpoint detector) system of a chemical mechanical polishing device.

Figure 2K:
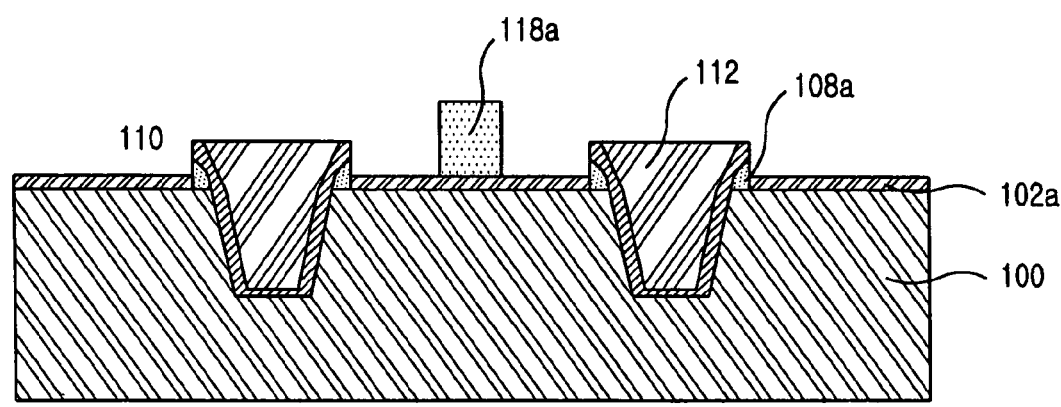

As shown in FIG. 2K, a gate electrode 118a is formed by removing the second nitride layer 114 and the etched first nitride layer 104a through an etch back process. In the illustrated example, phosphoric acid is used to remove the second nitride layer 114 and the etched first nitride layer 104a.

From the foregoing, persons of ordinary skill in the art will appreciate that example methods for forming a semiconductor device isolating barrier capable of suppressing current leakage at a periphery of a trench generated in forming the device isolating barrier in a semiconductor substrate have been disclosed. The methods illustrated herein improve the reliability and the characteristics of the manufactured semiconductor device.

Further, persons of ordinary skill in the art will appreciate that example methods for forming a gate electrode of a semiconductor device capable of increasing yield and reducing manufacturing cost by simplifying the gate electrode forming process have been provided. In the illustrated examples, a gate electrode is formed by using a pad oxide layer and a nitride layer, both of which are formed during the trench forming process.

A preferred example method illustrated herein includes: sequentially forming a pad oxide layer and a first nitride layer on top of a semiconductor substrate; forming a trench region by etching the pad oxide layer and the first nitride layer; forming spacers at sidewalls of the etched pad oxide layer and the etched first nitride layer; forming a first trench by etching the semiconductor substrate using the spacers and the etched first nitride layer as a mask; and, after forming a liner oxide layer and an oxide layer filling the trench on the semiconductor substrate, forming the device isolating barrier by flattening the liner oxide layer and the trench oxide layer to expose the etched first nitride layer.

An another example method for forming a gate electrode of a semiconductor device comprises: sequentially forming a pad oxide layer and a first nitride layer on top of a semiconductor substrate; forming a trench region by etching the pad oxide layer and the first nitride layer; forming spacers at sidewalls of the etched pad oxide layer and the etched first nitride layer; forming a first trench by etching the semiconductor substrate using the spacers and the etched first nitride layer as a mask; after forming a liner oxide layer and an oxide layer filling the first trench, forming the device isolating barrier by flattening the liner oxide layer and the trench oxide layer to expose the etched first nitride layer; after forming a second nitride layer on top of the etched first nitride layer, forming a second trench by etching the second nitride layer and the etched first nitride layer; after a conducting layer is formed to fill the second trench, flattening the conducting layer by removing the conducting layer to expose the second nitride layer; and forming the gate electrode by removing the second nitride layer and the etched first nitride layer.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a semiconductor device isolating barrier comprising:

forming a pad oxide layer and a nitride layer on a semiconductor substrate;

forming a trench region by etching the pad oxide layer and the nitride layer;

forming spacers at sidewalls of the etched pad oxide layer and the etched nitride layer;

forming a trench by etching the semiconductor substrate using the spacers and the etched nitride layer as a mask; and after forming a liner oxide layer and a trench oxide layer filling the trench, forming the device isolating barrier by flattening the liner oxide layer and the trench oxide layer to expose the etched nitride layer.

2. A method as defined in claim 1, wherein a thickness of the nitride layer ranges from about 500 to about 1000 Å.

3. The method of claim 1, wherein said step of forming a trench region comprises the steps of:

forming a photoresist layer on the nitride layer;

removing a portion or the photoresist layer where a trench will be formed; and etching the nitride layer and the pad oxide layer using the photoresist layer as a mask.

4. The method of claim 1, wherein said step of forming spacers comprises the steps of:

after forming the trench region, forming a spacer oxide layer in the trench region and on the nitride layer; and etching back the spacer oxide layer to leave the spacers at the sidewalls of the etched pad oxide layer and the etched nitride layer.

5. A method for forming a gate electrode of a semiconductor device comprising:

forming a pad oxide layer and a first nitride layer on a semiconductor substrate;

forming a trench region by etching the pad oxide layer and the first nitride layer;

forming spacers at sidewalls of the etched pad oxide layer and the etched first nitride layer;

forming a first trench by etching the semiconductor substrate using the spacers and the etched first nitride layer as a mask;

after forming a liner oxide layer and a trench oxide layer filling the trench, forming a device isolating barrier by flattening to liner oxide layer and the trench oxide layer the expose the etched first nitride layer;

after forming a second nitride layer on top of the etched first nitride layer, forming a second trench by etching the second nitride layer and the etched first nitride layer;

after a conducting layer is formed to fill the second trench, flattening the conducting layer to expose the second nitride layer; and forming the gate electrode by removing the second nitride layer and the etched first nitride layer.

6. A method as defined in claim 5, wherein a thickness of the first nitride layer ranges from about 500 to about 1000 Å.

7. A method as defined in claim 5, wherein a thickness of the second nitride layer ranges from about 1000 to about 1500 Å.

8. A method as defined in claim 5, wherein etching the second nitride layer and the etched first nitride layer comprises etching with an etching gas having a greater than a 7:1 selectivity of the first and second nitride layers with respect to the oxide layer.

9. A method as defined in claim 8, wherein the etching gas comprises a mixture of CO, $CHF_3$ and $C_4F_8$.

10. A method as defined in claim 5, comprising depositing the conducting layer through a LPCVD process at about 550 to about 650° C.

11. A method as defined in claim 10, wherein a thickness of the deposited conducting layer ranges from 2000 to 5000 Å.

12. A method as defined in claim 5, wherein flattening the conducting layer comprises performing a chemical mechanical polishing process, and wherein a thickness of the nitride layer left after the flattening process ranges from about 10 to about 90% of a thickness of the nitride layer before the flattening.

* * * * *